United States Patent [19]

Basi et al.

[11] 3,886,569

[45] May 27, 1975

[54] SIMULTANEOUS DOUBLE DIFFUSION INTO A SEMICONDUCTOR SUBSTRATE

[75] Inventors: Jagtar S. Basi, Wappingers Falls; Jagtar S. Sandhu, Fishkill, both of N.Y.

[73] Assignee: IBM Corporation, Armonk, N.Y.

[22] Filed: Mar. 29, 1973

[21] Appl. No.: 346,237

Related U.S. Application Data

[62] Division of Ser. No. 5,076, Jan. 22, 1970, Pat. No. 3,748,198.

[52] U.S. Cl. .................................... 357/54; 357/63

[51] Int. Cl. .............................................. H01l 7/00

[58] Field of Search ...................................... 317/235

[56] References Cited

UNITED STATES PATENTS 3,566,518 3/1971 Brown et al. ........................ 317/235

*Primary Examiner*—Michael J. Lynch
*Assistant Examiner*—E. Wojciechowicz
*Attorney, Agent, or Firm*—J. B. Kraft

[57] ABSTRACT

A simultaneous double diffusion method wherein a coating containing a silicon oxide and the oxides of a plurality of conductivity-determining impurities having different diffusivity rates is formed on the surface of a semiconductor substrate using a temperature at which substantially no diffusion of the impurities into the substrate will take place. Then, the substrate is heated to simultaneously diffuse the impurities into the substrate to form a plurality of abutting regions in the substrate separated by junctions. The sequence of regions in distance, with respect to the substrate surface, is controlled by the diffusivity rates of the selected conductivity-determining impurities. The coating may be a single layer or a plurality of layers, at least two of which contain different conductivity-determining impurities.

3 Claims, 3 Drawing Figures

SIMULTANEOUS DOUBLE DIFFUSION INTO A SEMICONDUCTOR SUBSTRATE

This is a division of application Ser. No. 5076 filed Jan. 22, 1970 and now U.S. Pat. No. 3,748,198.

BACKGROUND OF THE INVENTION

1. Field of the Invention

The present invention relates to the fabrication of semiconductor devices and integrated circuits and particularly to processes for diffusing conductivity-determining impurities into the semiconductor substrate.

2. Description of the Prior Art

With the advance in the art of fabrication of microminiature semiconductor devices and integrated circuits, processing expedients or short-cuts to eliminate conventional processing steps are constantly being sought. One expedient being sought is an effective and practical simultaneous double diffusion technique. By double diffusion, we mean the diffusion of more than one conductivity-determining impurity into a section of a semiconductor substrate. The time and temperature for the diffusion of each of the impurities, as well as the surface concentration and rate of diffusivity of the impurities, will determine the region in the substrate in which each of the impurities will predominate. The conductivity of each region will be determined by the significant impurity or the impurity which predominates in that region. Double diffusion usually involves two impurities, resulting in the formation of a pair of abutting regions separated by a junction. One of the regions is further removed from the surface being diffused into than is the other. The conductivity-determining impurities may be of opposite conductivity type, in which case a P and an N region will be formed separated by a rectifying junction. However, the two different impurities may be of the same conductivity type, in which case while the resulting regions will be of the same conductivity type, diffusion parameters may be selected so that the resulting regions have substantially different impurity levels, e.g., N and N+ or P and P+. In such a case, the junction is not a rectifying junction but one at which a substantial change in impurity level occurs.

In accordance with almost all standard double diffusion processes, the diffusion of each of the two or more impurities is carried out sequentially. For example, a first type of conductivity-determining impurity is diffused into the substrate surface during a time/temperature cycle sufficient to form a region in the substrate of a given depth having said first type conductivity. Then, an opposite conductivity-determining type impurity is diffused through said surface into said region at a concentration and additional time/temperature cycle sufficient to convert the portion of said first region closest to the surface to a second region which is of opposite type conductivity. It would be advantageous to the art of semiconductor device fabrication to have the ability to conduct the double diffusion simultaneously instead of sequentially and thereby eliminate one of the time/-temperature diffusion cycles.

One approach which has been attempted in the art has been a simultaneous vapor phase impurity involving the application of a vapor source containing the two or more impurities to be simultaneously diffused into the substrate. While this method is considered to have substantial potential by the art, it has at present been less than fully commercially successful because of concentration control problems, among others.

Another approach attempted in the art has involved the application of a silicon oxide layer containing the oxide of one of the impurities, such as phosphorous pentoxide, over the substrate surface. Then, the second impurity, which is a metal such as aluminum, in its elemental form is diffused from the vapor state through the silicon oxide layer into the substrate simultaneously with the diffusion of the first impurity into the substrate. The primary limitation of this method involves the relatively slow rate at which most elemental impurities pass through the oxide layer into the substrate. In fact, the rate is so slow that only a few impurities, such as gallium and aluminum, can pass through the oxide layer at an operable rate. However, even with gallium and aluminum impurities, the oxide layer must be so thin, i.e., in the order of less than 1,000A, usually deposited anodically (U.S. Pat. No. 3,303,070), that the problem of loss of the first impurity by outdiffusion from the oxide layer into the ambient arises.

SUMMARY OF THE INVENTION

Accordingly, it is a primary object of this invention to provide a practical method of simultaneous double diffusion.

It is a further object of the present invention to provide a method for simultaneously diffusing a plurality of impurities into a semiconductor substrate.

It is another object of the present invention to provide a method for diffusing a plurality of conductivity-determining impurities into a semiconductor substrate under conditions which are readily controlled.

It is an even further object of the present invention to provide a novel semiconductor structure which is utilizable in the double diffusion process of the present invention.

The present invention provides a method of simultaneous diffusing a plurality of conductivity-determining impurities into a semiconductor substrate to form a plurality of regions in the substrate which involves first forming on the substrate surface a coating comprising a silicon oxide and the oxides of a plurality of impurities, which impurities will respectively determine the conductivity of the plurality of regions in the substrate. Then, the coated substrate is heated at a time/temperature cycle sufficient to simultaneously diffuse the conductivity-determining impurities from the coating into the substrate. Since the time/temperature cycle to which each of the impurities is subjected is the same, the predominance of impurities in substrate regions will be determined primarily by the concentration of impurities and the rates of diffusivity of the respective impurities. As a result of the simultaneous diffusion, the semiconductor substrate will contain a plurality of abutting regions of differing conductivity determined respectively by the predominance of one of said impurities in each of said regions. The sequence of said regions in distance from the substrate surface is controlled by the concentrations and diffusivity rates of the respective impurities.

The silicon oxide coating may comprise a single layer containing the plurality of different impurity oxides, or it may comprise a plurality of layers, at least two of which have conductivity-determining contents different from each other.

Because of the greater rate of diffusivity of impurity oxides as compared to elemental impurities in silicon oxide layers, the oxides of virtually all conventional impurities may be used, irrespective of whether the coating is a single layer or multiple layer coating. During the diffusion step, the impurities, which are in the form of their respective oxides in the silicon oxide coating, diffuse through the coating as oxides. At the interface of the silicon oxide with the semiconductor material, e.g., silicon, in the substrate, the oxides of the impurity are reduced to free the elemental impurity which then proceeds to diffuse into the semiconductor material of the substrate.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 2:
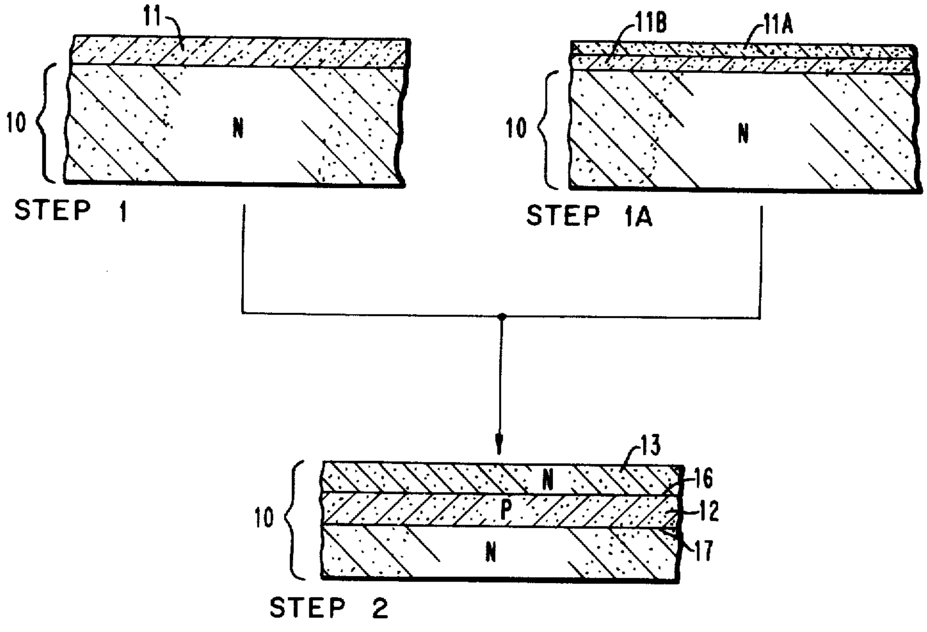
FIG. 2 is a flow diagram, in diagonal cross-section, showing the steps of two embodiments of the method of the present invention.

Referrring to FIG. 2 in step 1, a wafer of N type conductivity, having a relatively high resistivity in the order of 10 ohm-cm. and a thickness of about 7 to 15 mils is used as the starting substrate 10. The substrate is preferably a monocrystalline silicon structure fabricated by conventional techniques, such as crystal pulling from a melt containing the desired impurity concentration, followed by slicing the crystal into a plurality of wafers. Other semiconductor substrates, such as germanium, may be used. This substrate may also be an epitaxial layer of semiconductor material grown on another surface.

For the purpose of describing this invention, reference has been made to a semiconductor configuration wherein an N type region is utilized as the substrate and subsequent semiconductor regions of the structure are formed in the conductivity types shown in the drawings. However, it should be readily apparent that the substrate and the other regions in the drawings can be of reversed conductivity types from those shown.

A coating 11, of a silicon oxide insulating material, such as silicon dioxide, doped with the oxides of at least two different conductivity-determining impurities, is formed on a surface of substrate 10. The oxides in coating 11 may be of any of the conventional Group III (P type determining impurities) and Group V(N type determining impurities) elements used in semiconductor diffusion, e.g., boron, aluminum, gallium, indium, phosphorus, arsenic and antimony. Doped oxide layer 11 is preferably formed by any technique which will form a doped silicon oxide at temperatures below those at which the impurities in the oxide layer will diffuse into the semiconductor substrate.

Figure 1:
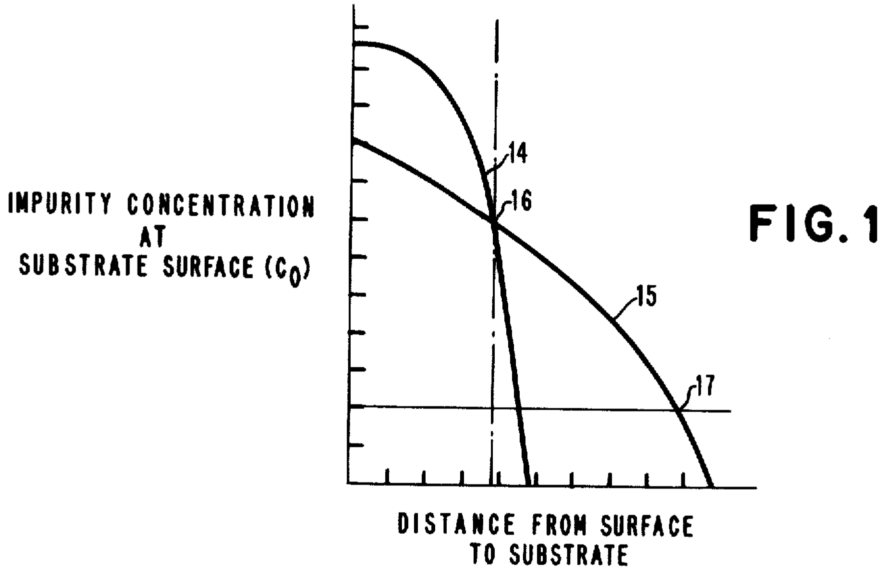
FIG. 1 is a diagrammatic graphical representation of the impurity distribution profiles in the semiconductor substrate of a pair of different conductivity-determining impurities.

For purposes of illustration, we will describe a method in which boron is used as the P type impurity and arsenic as the N type impurity. A silicon dioxide layer 11, doped with oxides of boron ($B_2O_3$) and arsenic ($As_2O_3$), is formed by pyrolytic deposition. The process for deposition of the doped oxide may be substantially the same as that described in U.S. Pat. No. 3,200,019, particularly FIG. 1 and Examples 1 and 2, and in RCA Review, September 1965, pp. 357–368, particularly pp. 359–361, except that in most cases, a plurality of dopants is dissolved in the ethyl silicate.

A very convenient method for forming a silicon dioxide layer doped with the oxides of boron and arsenic is the pyrolytic deposition method described in the article appearing in the Journal of the Electrochemical Society, May 1969, pp. 645–648. The present process may be substantially identical except that, in addition to being bubbled through the tetraethyl orthosilicate and the tripropyl borate, the argon carrier gas is also bubbled through triethyl arsinite, and the three resulting vapors are mixed. The mixture is passed over the silicon substrate, which is maintained at about 690° to 700°C., to deposit a layer of silicon dioxide, 5000A in thickness, doped with $B_2O_3$ and $As_2O_3$. The vapors are mixed in such proportions that layer 11 will have the following composition:

$B_2O_3$-8 mole-%
$As_2O_3$-15–20 mole-%
$SiO_2$-72–77 mole-%

If a carrier gas comprising a mixture of oxygen and argon is used instead of argon, the deposition temperature in the formation may be lowered from around 700° to 450°C.

Alternatively, as shown in step A, coating 11 may be formed in two steps. First, layer **11*b*, which is silicon dioxide doped with $B_2O_3$, is pyrolytically deposited by the above method, using a combination of only the vapors of tripropyl borate and tetraethyl orthosilicate. Next, layer 11**a, which is silicon dioxide doped with $As_2O_3$, is formed in a separate pyrolytic deposition in the same manner except using a mixture of triethyl arsinite and tetraethyl orthosilicate.

Then, in step 2, the coated structure of either step 1 or 1A is heated at a temperature of 1050°C. for 2 to 4 hours to diffuse the arsenic and boron into semiconductor substrate 10, thereby forming N type region 13 in which arsenic is the predominant impurity, and P type region 12 in which boron is the predominant impurity. Coating 11 is removed to provide the completed structure of step 2. The structure of step 2 in FIG. 2 will have an impurity distribution profile approximating that shown in FIG. 1. The arsenic, which has the slower rate of diffusivity in the silicon substrate, has an initial concentration, $C_0$, at the surface of about $2\times10^{21}$ cm$^{-3}$ and a profile 14, while the boron has an initial concentration, $C_0$, of about $6\times10^{19}$ cm$^{-3}$ and a greater rate of diffusivity resulting in profile 15. Thus, between the surface and level 16 in the semiconductor substrate, the arsenic will be the predominant impurity and the region will be of N type conductivity, shown as region 13 of FIG. 2. Below level 16, boron will be the predominant impurity and region 12 will be of P type impurity. Level 16 will be the NP junction shown in FIG. 2. After level 17, the concentration of the boron impurity will fall below $10^{16}$ to $10^{17}$ cm$^{-3}$ which is the constant impurity level of N type substrate 10. Below level 17, which is shown as the PN junction in FIG. 2, the substrate 10 will retain its original N type conductivity.

Coating 11 may be formed by other methods, such as commercially available paint-on films which are coatings of silicon dioxide and an impurity oxide, such as $B_2O_3$, in a suitable volatile liquid vehicle. The coating is usually applied at room temperature and the volatile vehicle is evaporated to leave a layer of silicon dioxide containing the impurity oxide. The paint-on coating composition may be modified so as to include a plurality of different impurity oxides, or a first paint-on coating containing one impurity oxide may be applied, followed by a second paint-on coating containing a different impurity.

The doped coating may also be deposited anodically, as described in the article entitled "Anodic Oxide Films for Device Fabrication Silicon", P. F. Schmidt et al, Journal of the Electrochemical Society, June 1964, pp. 682–688, and also in the article by A. E. Owen and P. F. Schmidt appearing in the Journal of the Electrochemical Society, May 1968, pp. 548–553. Since the coatings in anodic deposition are limited to thicknesses in the order of up to 1000A, an undoped silicon oxide layer is preferably deposited over coating 11 in accordance with the latter publication in order to prevent the loss of dopants from the oxide layer by out-diffusion into the ambient.

The doped silicon oxide layers may also be formed by reacting oxygen with a mixture of silane ($SiH_4$) and a plurality of hydrides of different impurities. The silane will be converted into silicon dioxide and the hydrides will be converted into the oxides of the impurities. The RCA Review, December 1968, pp. 549–556, describes this procedure for producing doped silicon dioxide. In forming the doped silicon dioxide coatings, the present process uses the hydrides of a plurality of impurities.

Where a plurality of silicon oxide layers is used, not all of the layers need contain dopant. For example, as previously described, an undoped silicon oxide layer may be used over the doped layers to prevent out-diffusion into the ambient. Also, an undoped layer may be used between the doped layers and the substrate or between two of the doped layers as an additional expedient for controlling the diffusion into the substrate. In this manner, it is possible to utilize the rate of diffusivity of one or more of the impurity oxides in the oxide layer as an additional control in forming the diffused regions in the substrate. In this case, it appears that while elemental boron has a greater rate of diffusivity than elemental arsenic in a silicon substrate, boron oxide has a lower rate of diffusivity than arsenic oxide in a silicon dioxide coating. Such a transition in rates of diffusivity at the oxide/semiconductor interface may provide a useful expedient in the tailoring of specific diffused structures.

Figure 3:
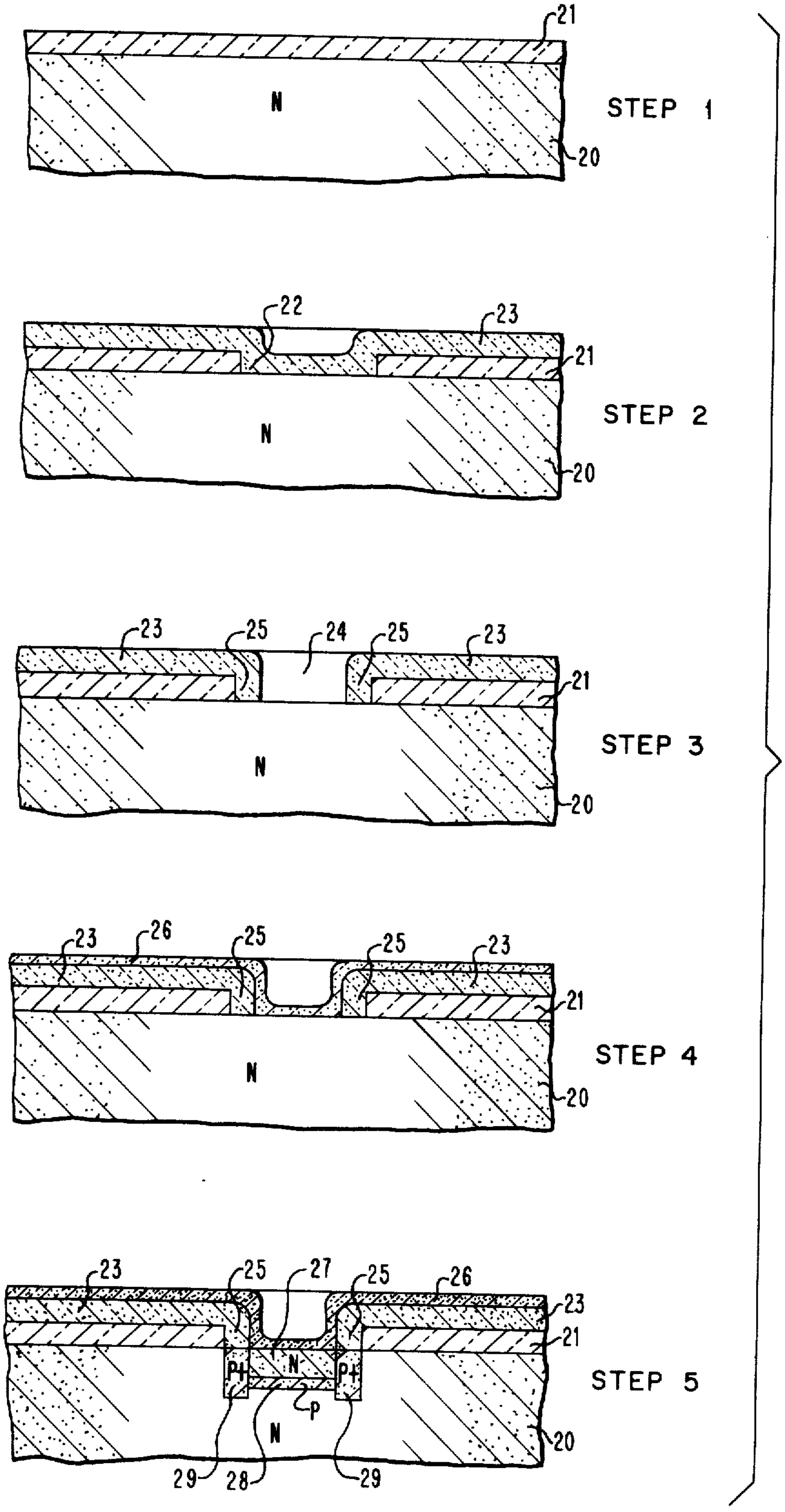
FIG. 3 is a flow diagram, in diagonal cross-section, showing the steps in a further embodiment of the method of the present invention.

In the formation of specific devices on integrated circuits, it may be advantageous to carry out the simultaneous diffusion of a plurality of impurities into one portion of a semiconductor substrate concurrently with the diffusion of another impurity into another portion of the substrate. Such an embodiment of the present method is shown in FIG. 3. Copending application Ser. No. 369,478, Barson et al, "A Method of Making High Frequency Transistors", filed May 18, 1967, describes a method of making a planar transistor structure in which the intrinsic or active portion of the base is of relatively narrow width and high resistivity, while the extrinsic portions of the base to which the ohmic contacts are to be made are of thicker width and lower resistivity. The procedure of FIG. 3 discloses how the method of the present invention may be used to fabricate such a transistor structure in a single time/temperature diffusion cycle.

In step 1, an N type silicon wafer having a resistivity in the order of 10 ohm-cm. and a thickness of about 7 to 15 mils is used as the starting substrate 20. An undoped silicon dioxide insulative coating 21 is formed in any conventional manner on the surface of substrate 20. In the present case, since the substrate 20 is silicon, insulative coating 21 may be formed by thermal oxidation of the substrate. Then, using the standard photoresist and acid etch techniques known in the art, an opening 22 is formed in undoped silicon dioxide layer 21, as shown in step 2. Opening 22 has the same lateral dimensions as the base region to be subsequently formed in the substrate. Then, using any of the previously described deposition techniques, layer 23, comprising silicon dioxide doped with $B_2O_3$, is formed over the structure. Insulative silicon dioxide layer 21 should be of sufficient thickness to prevent the diffusion of any $B_2O_3$ from layer 23 from diffusing through layer 21 to substrate 20 during the time/temperature cycle to be used in the subsequently described diffusion step.

Using conventional etching techniques, a hole 24 is etched through coating 22, as shown in step 3. Hole 24 has the lateral dimensions of the intrinsic base region and of the emitter region to be subsequently formed in he substrate. Section 25, of $B_2O_3$ doped oxide layer 23, remains in contact with silicon substrate 20. Section 25, which has the lateral dimensions of the extrinsic base region to be formed in the substrate, will act as the dopant source for this region during the subsequently performed diffusion step.

In step 4, layer 26, of silicon dioxide doped with $B_2O_3$ and $As_2O_3$, is deposited by any of the previously described methods. At this stage, there are in contact with the substrate the dopant sources necessary to form the transistor.

Next, as shown in step 5, the structure is subjected to a time/temperature cycle of 1050°C. for about 2 to 4 hours to form the transistor structure. As previously indicated, the boron impurity being diffused into the substrate has a greater rate of diffusivity in the silicon than does the arsenic. Thus, the concentrations of $As_2O_3$ and $B_2O_3$ in oxide layer 26 are selected such that the simultaneous double diffusion from oxide layer 26 will result in emitter region 27, in which the arsenic impurity predominates, and intrinsic base region 28, in which the boron predominates. In addition, the concentration of the $B_2O_3$ in section 25 of oxide layer 23 must be sufficiently greater than the concentration of the $B_2O_3$ in layer 26 so as to provide thicker and more highly doped P+ extrinsic base region 29.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor structure comprising:

a semiconductor substrate;

a first silicon oxide layer on a surface of said substrate comprising the oxide of a first-type conductivity-determing impurity; and one or more additional silicon oxide layers, at least one of said additional layers containing the oxide of an opposite-type conductivity-determining impurity, said first-type and said opposite-type impurities having different diffusivity rates in the semiconductor substrate, the concentration of the oxide of said first-type conductivity-determining impurity and the concentration of the oxide of said opposite-type conductivity-determining impurity being such that upon heating at diffusion temperatures in the order of 1050° C, regions of said first-type and said opposite-type conductivity respectively having concentrations of at least $10^{16}$ atoms/$cm^3$ will form a junction in the substrate below said first and additional layers.

2. The structure of claim 1 wherein said semiconductor substrate is silicon.

3. The structure of claim 2 wherein said silicon oxide is silicon dioxide.

* * * * *